(12) United States Patent
Diglio et al.

(10) Patent No.: US 11,073,538 B2
(45) Date of Patent: Jul. 27, 2021

(54) ELECTRICAL TESTING APPARATUS WITH LATERAL MOVEMENT OF A PROBE SUPPORT SUBSTRATE

(71) Applicant: Intel Corporation, Santa Clara, CA (US)

(72) Inventors: Paul Diglio, Gaston, OR (US); Joe Walczyk, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 636 days.

(21) Appl. No.: 15/861,597

(22) Filed: Jan. 3, 2018

(65) Prior Publication Data

US 2019/0204358 A1 Jul. 4, 2019

(51) Int. Cl.
*G01R 1/073* (2006.01)
*G01R 1/067* (2006.01)
*H01L 21/00* (2006.01)

(52) U.S. Cl.
CPC ..... *G01R 1/07364* (2013.01); *G01R 1/06783* (2013.01); *G01R 1/07378* (2013.01); *G01R 1/06727* (2013.01)

(58) Field of Classification Search
CPC ........ H01L 21/00; H01L 2221/00; G01R 1/00
See application file for complete search history.

(56) References Cited

U.S. PATENT DOCUMENTS

| | | |
|---|---|---|
| 3,622,387 A | 11/1971 | Grandadam |
| 4,581,260 A | 4/1986 | Mawla |
| 5,307,560 A | 5/1994 | Aksu |
| 5,453,701 A * | 9/1995 | Jensen ............... G01R 1/07314 324/750.05 |
| 5,592,222 A | 1/1997 | Nakamura et al. |
| 5,767,692 A | 6/1998 | Antonello et al. |
| 5,917,329 A | 6/1999 | Cadwallader et al. |
| 6,130,545 A | 10/2000 | Kiser et al. |
| 6,292,004 B1 | 9/2001 | Kocher |

(Continued)

FOREIGN PATENT DOCUMENTS

| | | |
|---|---|---|
| EP | 0962776 | 12/1999 |
| JP | 11-344510 | 12/1999 |

OTHER PUBLICATIONS

Darling, K.A. et al., "Mitigating grain growth in binary nanocrystalline alloys through solute selection based on thermodynamic stability maps", Computational Material Science; 84 (2014), 255-266.

(Continued)

*Primary Examiner* — Jermele M Hollington
*Assistant Examiner* — Temilade S Rhodes-Vivour
(74) *Attorney, Agent, or Firm* — Green, Howard & Mughal LLP.

(57) ABSTRACT

An electrical-test apparatus is provided, which includes a plurality of tester interconnect structures cantilevered from a first side of a substrate. A base may be coupled to a second side of the substrate via one or more interconnect layers. The tester interconnect structures may contact corresponding interconnect structures of a device under test (DUT). In an example, the substrate is laterally movable relative to the DUT along a plane of the substrate, upon contact between the tester interconnect structures and the interconnect structures of the DUT.

19 Claims, 14 Drawing Sheets

(56) References Cited

U.S. PATENT DOCUMENTS

| | | | |
|---|---|---|---|
| 6,356,090 B2 | 3/2002 | Deshayes | |
| 6,441,315 B1* | 8/2002 | Eldridge | H01R 13/2407 |
| | | | 174/260 |
| 6,740,163 B1 | 5/2004 | Curtiss et al. | |
| 6,812,718 B1 | 11/2004 | Chong et al. | |
| 7,189,077 B1 | 3/2007 | Eldridge et al. | |
| 7,436,193 B2 | 10/2008 | Crippen | |
| 7,566,228 B2* | 7/2009 | Chiu | H01R 13/2442 |
| | | | 439/66 |
| 7,884,632 B2 | 2/2011 | Shiraishi et al. | |
| 7,928,522 B2* | 4/2011 | Zhu | B81B 7/007 |
| | | | 257/415 |
| 8,029,291 B2 | 10/2011 | Park | |
| 8,411,550 B2* | 4/2013 | Chou | G11B 9/1445 |
| | | | 369/126 |
| 2002/0024347 A1 | 2/2002 | Felici et al. | |
| 2002/0163349 A1 | 11/2002 | Wada et al. | |
| 2005/0151547 A1 | 7/2005 | Machida et al. | |
| 2005/0231855 A1 | 10/2005 | Tran | |
| 2005/0263401 A1 | 12/2005 | Olsen et al. | |
| 2006/0151614 A1* | 7/2006 | Nishizawa | H01L 24/97 |
| | | | 235/492 |
| 2006/0171425 A1 | 8/2006 | Lee et al. | |
| 2007/0126435 A1 | 6/2007 | Eldridge et al. | |
| 2007/0126440 A1 | 6/2007 | Hobbs et al. | |
| 2007/0290371 A1 | 12/2007 | Chen | |
| 2008/0088327 A1 | 4/2008 | Kister | |
| 2008/0196474 A1 | 8/2008 | Di Stefano et al. | |
| 2008/0204061 A1 | 8/2008 | Chartarifsky et al. | |
| 2008/0231300 A1 | 9/2008 | Yamada et al. | |
| 2008/0309363 A1 | 12/2008 | Jeon et al. | |
| 2009/0219047 A1 | 9/2009 | Peterson et al. | |
| 2009/0237099 A1* | 9/2009 | Garabedian | G01R 3/00 |
| | | | 324/756.03 |
| 2010/0052715 A1 | 3/2010 | Beaman et al. | |
| 2010/0066393 A1 | 3/2010 | Bottoms et al. | |
| 2010/0079159 A1 | 4/2010 | Kemmerling | |
| 2010/0276572 A1 | 11/2010 | Iwabuchi et al. | |
| 2011/0031991 A1 | 2/2011 | Lee et al. | |
| 2011/0115513 A1 | 5/2011 | Harada | |
| 2011/0234251 A1 | 9/2011 | Komatsu et al. | |
| 2012/0038383 A1 | 2/2012 | Wu et al. | |
| 2012/0071037 A1 | 3/2012 | Balucani | |
| 2012/0117799 A1 | 5/2012 | Luo | |
| 2012/0319710 A1 | 12/2012 | Dabrowiecki et al. | |
| 2013/0002285 A1* | 1/2013 | Nelson | G01R 1/067 |
| | | | 324/755.09 |
| 2013/0099812 A1 | 4/2013 | Wang et al. | |
| 2013/0200910 A1 | 8/2013 | Ellis-Monaghan et al. | |
| 2013/0285688 A1 | 10/2013 | Namburi et al. | |
| 2014/0021976 A1 | 1/2014 | Tanaka | |
| 2014/0125372 A1 | 5/2014 | Fukasawa et al. | |
| 2014/0253162 A1 | 9/2014 | Wang | |
| 2014/0347085 A1 | 11/2014 | Kuo et al. | |
| 2014/0362425 A1* | 12/2014 | Stephens | G02B 26/0833 |
| | | | 359/107 |
| 2014/0363905 A1* | 12/2014 | McShane | G02B 6/30 |
| | | | 438/17 |
| 2015/0123693 A1 | 5/2015 | Ota et al. | |
| 2015/0192633 A1 | 7/2015 | Garibay et al. | |
| 2016/0079635 A1 | 3/2016 | Niwa | |
| 2016/0178663 A1 | 6/2016 | Prabhugoud et al. | |
| 2017/0219626 A1 | 8/2017 | Gardell et al. | |
| 2018/0003767 A1 | 1/2018 | Crippa et al. | |
| 2019/0203370 A1 | 7/2019 | Walczyk et al. | |
| 2019/0212366 A1 | 7/2019 | Tadayon et al. | |
| 2020/0025801 A1 | 1/2020 | Tadayon et al. | |

OTHER PUBLICATIONS

Luo, J.K. et al., "Young's modulus of electroplated Ni thin film for MEMS applications", Materials Letters, vol. 58, Issues 17-18, Jul. 2004, pp. 2306-2309.

Weeden, et al., "Probe Card Tutorial", www.tek.com/keithley, 2003, 40 pages, Keithley Instruments, Inc.

Wikipedia, "Probe Card", last edited on Jul. 29, 2016, 2 pages, Wikipeadia, https://en.wikipedia.org/wiki/probe_card.

* cited by examiner

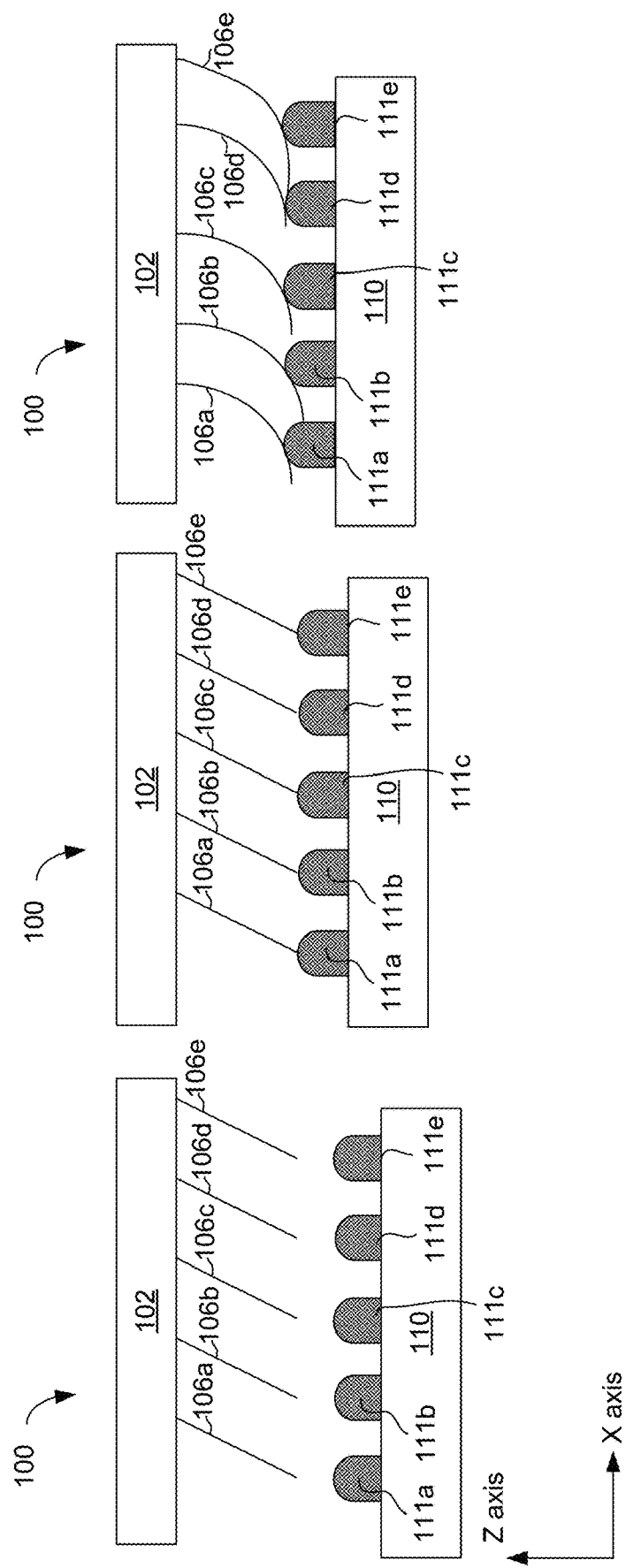

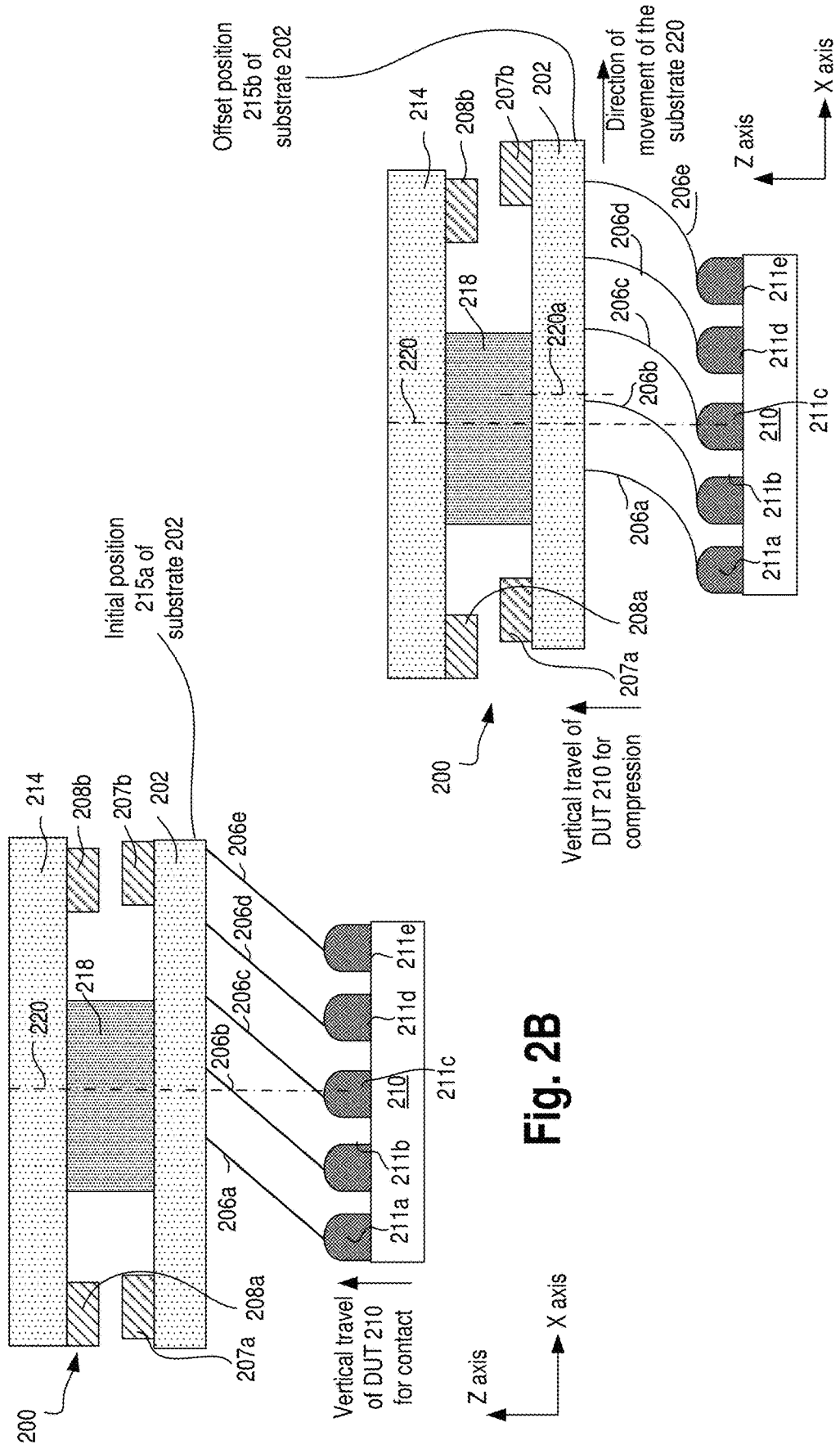

US 11,073,538 B2

ELECTRICAL TESTING APPARATUS WITH LATERAL MOVEMENT OF A PROBE SUPPORT SUBSTRATE

BACKGROUND

Tester interconnect solutions (e.g., test probes) are used for testing semiconductor devices at wafer or package level. These test probes usually have to be compressible, provide adequate amount of force to achieve stable and repeatable electrical contacts, and be able to repeat testing over several cycles. In some examples, a compression force between such a test probe and an interconnect structure of a device under (DUT) test may increase, such that the test probe may slip off the interconnect structure of the DUT.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIGS. 1A, 1B, and 1C illustrate scenarios associated with one or more tester interconnect structures of an electrical test apparatus possibly getting shorted.

FIGS. 2A-2D illustrate an electrical test apparatus, in which a probe support substrate is laterally movable with respect to devices under test, according to some embodiments.

DETAILED DESCRIPTION

Figure 2A:
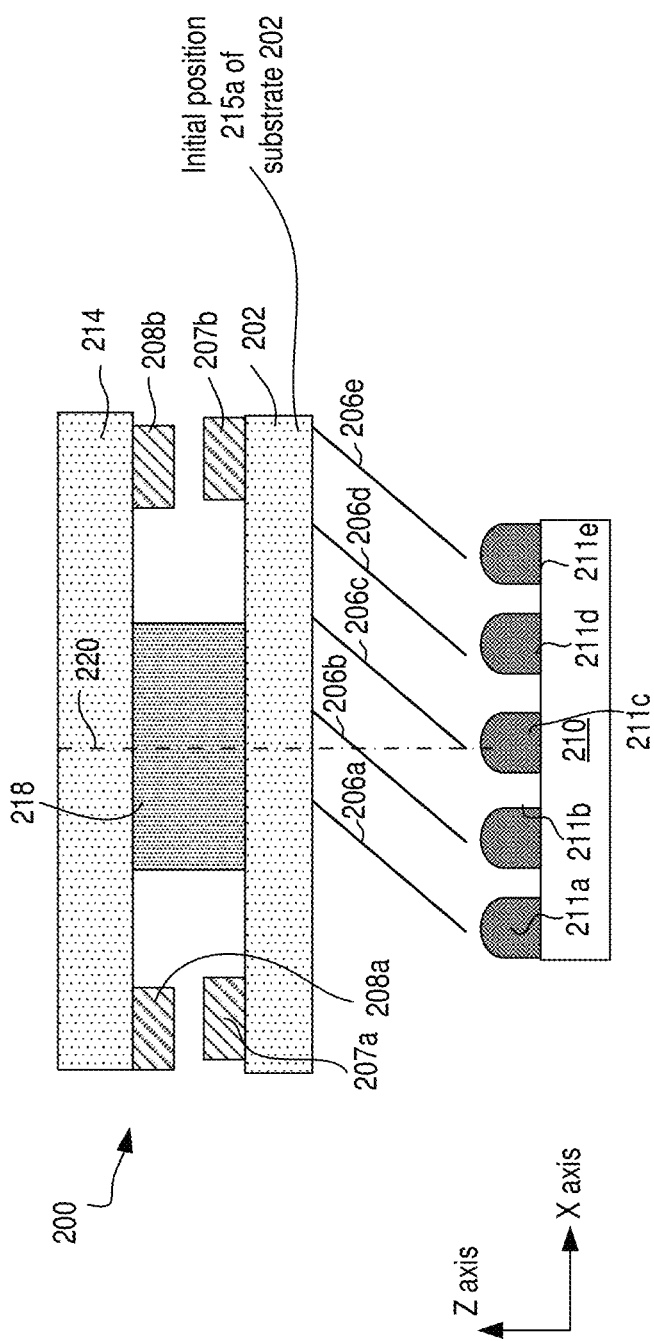

FIGS. 1A, 1B, and 1C illustrate scenarios associated with one or more tester interconnect structures (also referred to as test probes, or probes) 106a, 106b, 106c, 106d, and 106e of an electrical test apparatus 100 (also referred to herein as apparatus 100) possibly getting shorted. These figures schematically illustrate a cross sectional view of the apparatus 100 and a device under test (DUT) view 110.

Elements referred to herein with a common reference label followed by a particular number or alphabet may be collectively referred to by the reference label alone. For example, probes 106a, 106b, 106c, 106d, and 106e may be collectively and generally referred to as probes 106 in plural, and probe 106 in singular.

The apparatus 100 may include a probe support substrate 102 (also referred to as substrate 102), to which the probes 106 are attached. The apparatus 100 may further include various other components attached to the substrate 102 (e.g., a space transformer, a test card, etc.), although such components are not illustrated in FIGS. 1A-1C for purposes of illustrative clarity.

The apparatus 100 may test multiple DUTs, e.g., a DUT 110. The example DUT 110 has a plurality of interconnect structures 111a, 111b, 111c, 111d, and 111e. During testing of the DUT 110, a probe 106 of the apparatus 100 is to contact a corresponding interconnect structure 111 of the DUT 110. For example, the probe 106a is to contact the interconnect structure 111a, the probe 106b is to contact the interconnect structure 111b, and so on.

In FIG. 1A, the probes 106 of the apparatus 100 are not yet in contact with the interconnect structures 111 of the DUT 110. When the DUT 110 is to be tested, the DUT 110 is lifted vertically (e.g., in the Z axis direction) with respect to the apparatus 100, as illustrated in FIG. 1B. In FIG. 1B, the probes 106 barely make contact with the interconnect structures 111.

In an example, to ensure reliable contact between the probes 106 and the interconnect structures 111, the probes 106 are compressed relative to the interconnect structures 111. For example, FIG. 1C illustrates the probes 106 being compressed against the interconnect structures 111. Such compression may be achieved by further lifting vertically the DUT 110 with respect to the apparatus 100, as illustrated in FIG. 1C.

The probes 106 are flexible or compressible. For example, when compressed against the interconnect structures 111, the probes 106 may make some lateral movement and may possibly bend, as illustrated in FIG. 1C.

In some examples, lateral force to vertical force ratio exists in the probes 106. For example, as the vertical compression force on the probes 106 increases, the lateral force on the probes 106 may also increase (e.g., increase proportionally). In some examples, this lateral force may cause one or more probes to slip or slide off the corresponding interconnect structures, e.g., causing electrical short with the neighboring structure or electrical opens.

In an example, if the probes 106 are over-compressed with respect to the interconnect structures 110 (e.g., if the DUT 110 is raised vertically in the Z axis direction higher than intended), the probes 106 may be laterally scrubbed (e.g., moved laterally) with respect to the interconnect structures 111. For example, the probe 106b may have high lateral movement, due to which the probe 106b may get shorted with the non-target interconnect structure 111a. The probe 106e similarly may get in contact with the neighboring probe 106d, and may get jammed. Some of the probes may slide off at least partially from the corresponding target interconnect structure 111. Such unintended phenomena may be more pronounced for relatively fine pitch of the probes 106 (e.g., center-to-center distance between two adjacent probes), relatively high length of the probes 106, relatively high compression force between the probes 106 and the interconnect structure 111, etc.

In modern testing apparatus, the probe density is increasing at a dramatic rate. For example, a pitch of the probes may be as low as 50 microns, 30 ns, or even lower on some products. As discussed with respect to FIGS. 1A-1C, the lateral movement of the probes may create challenges for low pitch probes. For example, as the probe support substrate is rigidly (e.g., laterally) locked with respect to the DUT, the probes may damage the contacting interconnect structures of the DUT, e.g., due to a probe slipping off an edge of an interconnect structure of the DUT, possibly contacting a neighboring non-target interconnect structure, etc. In another example, the entire DUT may slide away from the probes, which may damage the DUT.

In some embodiments, possible slippage of a probe relative to a target interconnect structure of a DUT can be avoided by having a probe support substrate move laterally relative to the DUT. For example, upon contact and an initiation of compression between the probes and the interconnect structures of the DUT, the substrate carrying the probes moves laterally relative to the DUT. The substrate may be at least in part free floating, and the force for such lateral movement of the substrate may be derived from the compression force between the probes and the interconnect structures of the DUT. As discussed in further details herein, such a lateral movement of the substrate and the attached probes may prevent or reduce any slippage of the probes from the corresponding interconnect structures of the DUT, and prevent or reduce the negative effects discussed with respect to FIGS. 1A-1C. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on." The terms "substantially," "close," "approximately," "near," and "about," generally refer to being within +/−10% of a target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIGS. 2A-2D illustrate an electrical test apparatus 200 (also referred to as apparatus 200), in which a probe support substrate 202 is laterally movable with respect to devices under test (e.g., a DUT 210), according to some embodiments. These figures schematically illustrate a cross sectional view of the apparatus 200 and the DUT 210.

The apparatus 200 may include a probe support substrate 202 (also referred to as substrate 202), to which the probes 206 are attached. Although only five probes 206a, 206b, 206c, 206d, and 206e are illustrated in FIGS. 2A-2D, the apparatus 200 is likely to include more number of probes, e.g., hundreds, thousands, tens or even hundreds of thousands of probes.

The apparatus 200 further includes a base 214. In an example, the base 214 may be a test card (e.g., a printed circuit board or PCB) that includes one or more processors and memory to test the DUT 210. In another example, the base 214 may be a test card coupled to one or more components, where the one or more components include one or more processors and memory to test the DUT 210.

In some embodiments, the substrate 202 is electrically coupled to the base 214 via one or more interconnect layers 218. The interconnect layers 218 electrically couple the base 214 and the substrate 202, and also allow lateral movement between the base 214 and the substrate 210, as will be discussed in further detail herein.

In some embodiments, the apparatus 200 includes a return coupling arrangement that mechanically couples the substrate 202 to the base 214, allows lateral movement of the substrate 202 with respect to the base 214, and/or also exerts a return force to bring back the substrate 202 to its original position, as will be discussed in further detail herein. In some embodiments, the return coupling arrangement is a spring based return coupling, a magnetic return coupling, an air pressure based return coupling, and/or the like.

In the example apparatus 200 of FIGS. 2A-2D, the return coupling arrangement is a magnetic return coupling arrangement. For example, the magnetic return coupling includes magnets 208a and 208b attached to the base 214, and magnets 207a and 207b attached to the substrate 202 (although in some examples, the magnets 207a and 207b may be attached to a carrier, which may be attached to the substrate 202, as discussed with respect to FIG. 3). The apparatus 200 may include various other components (e.g., some of which are discussed herein later with respect to FIG. 3), although such components are not illustrated in FIGS. 1A-1C for purposes of illustrative clarity.

The apparatus 200 may test multiple DUTs one after another, e.g., the DUT 210. The example DUT 210 has a plurality of interconnect structures 211a, 211b, 211c, 211d, and 211e. During testing of the DUT 210, a probe 206 of the apparatus 200 is to contact a corresponding target interconnect structure 211 of the DUT 210. For example, the probe 206a is to contact its target interconnect structure 211a, the probe 206b is to contact its target interconnect structure 211b, and so on.

Referring to FIG. 2A, illustrated is a central axis 220 of the base 214. For example, the central axis 220 may pass through a central point of the cross section of the base 214. In the example of FIG. 2A and merely for ease of explanation, it is assumed that the central axis 220 of the base 214 coincides with the central axis of the substrate 202 and the central axis of the DUT 210 (although in other examples, the central axis 220 of the base 214 need not coincide with the central axes of the substrate 202 and/or the DUT 210). The position of the substrate 202 in FIG. 2A is referred to as an initial position 215a of the substrate 202. Thus, the substrate 202 in in the initial position when the probes 206 do not contact the corresponding interconnect structures 211 (e.g., when the axes of the base 214 and the substrate 202 coincides).

In FIG. 2A, the probes 206 of the apparatus 200 are not yet in contact with the interconnect structures 211 of the DUT 210. When the DUT 210 is to be tested, the DUT 210 traverses vertically (e.g., in the Z axis direction) with respect to the apparatus 200, as illustrated in FIG. 2B. In FIG. 2B, the probes 206 barely make contact with the interconnect structures 211. No compression or pressure is yet applied between the probes 206 and the interconnect structures 211. There is no lateral movement yet between the substrate 202 and the DUT 210—hence, the central axis 220 of the base still matches the central axis of the substrate 202 and the DUT 211. Thus, in FIG. 2B, the substrate 202 is still in the initial position 215a.

In an example, prior to any lateral movement of the substrate 202 with respect to the base 214 or the DUT 210 (e.g., at the initial position 215a of the substrate 202), the magnets 207 may be at a or near a neutral or equilibrium position, or may be slightly offset, with respect to the magnets 208. For example, the magnet 207a may be at or near a neutral or equilibrium position, or slightly offset, with respect to the magnet 208a; and the magnet 207b may be at or near a neutral or equilibrium position, or may be slightly offset, with respect to the magnet 208b. In an example, the magnets 207a and 208a may be of opposite polarity, and the magnets 207b and 208b may be of opposite polarity.

In an example, at the initial position 215a of the substrate 202, there may not be any magnetic force trying to move the substrate 202. In such examples, the magnet 207a and 208a may be aligned (e.g., centers of the magnets 207a and 208a may be aligned), and the magnet 207b and 208b may be aligned. Thus, the only magnetic force generated at the initial position 215a of the substrate 202 is a vertical force that aids in keeping the substrate 202 vertically coupled to the base 214. Thus, in such embodiments, the magnets 207 and 208 may not exert any lateral magnetic force to laterally move the substrate 202 in any direction.

In some other examples, even at the initial position 215a of the substrate 202, the magnets 207a and 208a may be slightly misaligned (e.g., centers of the magnets 207a and 208a may be slightly offset), and the magnets 207b and 208b may be slightly misaligned. Thus, even at the initial position 215 of FIGS. 2A-2B, the substrate 202 may experience a slight magnetic force to move the substrate 202 further towards the left. A hard-stop component (not illustrated in FIGS. 2A-2D) may prevent the substrate 202 from any further movement towards left. Thus, the hard-stop component may prevent perfect alignment of the magnets 207a and 208a, and may prevent perfect alignment of the magnets 207b and 208b.

In an example, to ensure reliable contact between the probes 206 and the interconnect structures 211, the probes 206 are compressed to be against the interconnect structures 211. For example, FIG. 2C illustrates the probes 206 being compressed against the interconnect structures 211. Such compression may be achieved by further lifting vertically the DUT 210 in the Z axis direction with respect to the apparatus 200, as illustrated in FIG. 2C.

In some embodiments, the probes 206 are flexible or compressible. For example, when compressed against the interconnect structures 211, the probes 206 may bend, as illustrated in FIG. 2C.

In some embodiments, upon initiation of the compression of the probes 206 and the interconnect structures 211, the substrate 202 moves laterally with respect to the base 220 and the DUT 210 (e.g., to an offset position 215b of the substrate 202). For example, the substrate 202 moves laterally in the X axis direction, as illustrated in FIG. 2C. In an example, the base 214 does not move laterally with respect to the DUT 210. Thus, in FIG. 2C, the central axis 220 of the base 214 still coincides with the central axis of the DUT 210. However, now a central axis 220a of the substrate 202 is shifted left of the central axis 220 of the base 214, as illustrated in FIG. 2C. Similarly, the central axis 220a of the substrate 202 is also shifted with respect to that of the DUT 210.

In an example, the offset position 215b may be up to 500 microns, or even more, apart from the initial position 215a. Thus, the substrate 202 may move up to 500 microns, or even more, in some examples.

In some embodiments, as the substrate 202 moves laterally with respect to the DUT 210, unlike FIG. 1C, the lateral scrubbing of the contact tips of the probes 206 with respect to the interconnect structures 211 may be reduced or eliminated in FIG. 2C. In some embodiments, the compression between the probes 206 and the interconnect structures 211 causes the lateral shift of the substrate 202. For example, the lateral movement may initiate upon an initiation of the compression force between the probes 206 and the interconnect structures 211.

In some examples, lateral force to vertical force ratio exists in the probes 206. For example, as the vertical compression force on the probes 206 increases (e.g., due to the upward Z-axis movement of the DUT), the lateral force on the probes 206 may also increase (e.g., increase proportionally). In some examples, this lateral force may cause the substrate 202 to move laterally (e.g., as the substrate 202 is at least in part free-floating and laterally moveable).

For example, in FIG. 1C, the compression force between the probes 106 and the interconnect structures 111 was causing the probes 106 to bend and slide off the interconnect structures 111 (as the substrate 102 was rigid or laterally fixed with respect to the DUT 110). In contrast, in FIG. 2C, as the substrate 202 is free floating and can laterally move with respect to the DUT 210, the compression force between the probes 206 and the interconnect structures 211 can cause lateral movement of the substrate 202 with respect to the DUT 210, thereby preventing the probes 206 from sliding off from the corresponding interconnect structures 211.

In some embodiments, after the substrate 202 has moved laterally to the offset position 215b, the neutral or equilibrium positions of the magnets 207 and 208 are distributed. For example, as discussed herein above, at the initial position 215a of the substrate 202, the magnets 207 and 208 may be either aligned, or slightly misaligned. However, at the offset position 215b, the misalignment between the magnet 207a and 208a, and also between the 207b and 208b, may be relatively large (e.g., larger than any possible misalignment for the initial position 215a). For example, the magnet 207a may try to laterally move towards magnet 208a, and the magnet 207b may try to laterally move towards magnet 208b. Thus, magnetic force may be generated between the magnets 207a and 208a, and also between magnets 207b and 208b, to bring the substrate 202 back to its initial position 215a—such magnetic force is also referred to as return magnetic force. While the DUT 210 is being tested, the compression force between the probes 206 and the interconnect structures 211 may overpower the return magnetic force, to keep the substrate 202 at the offset position 215a.

Figure 2D:
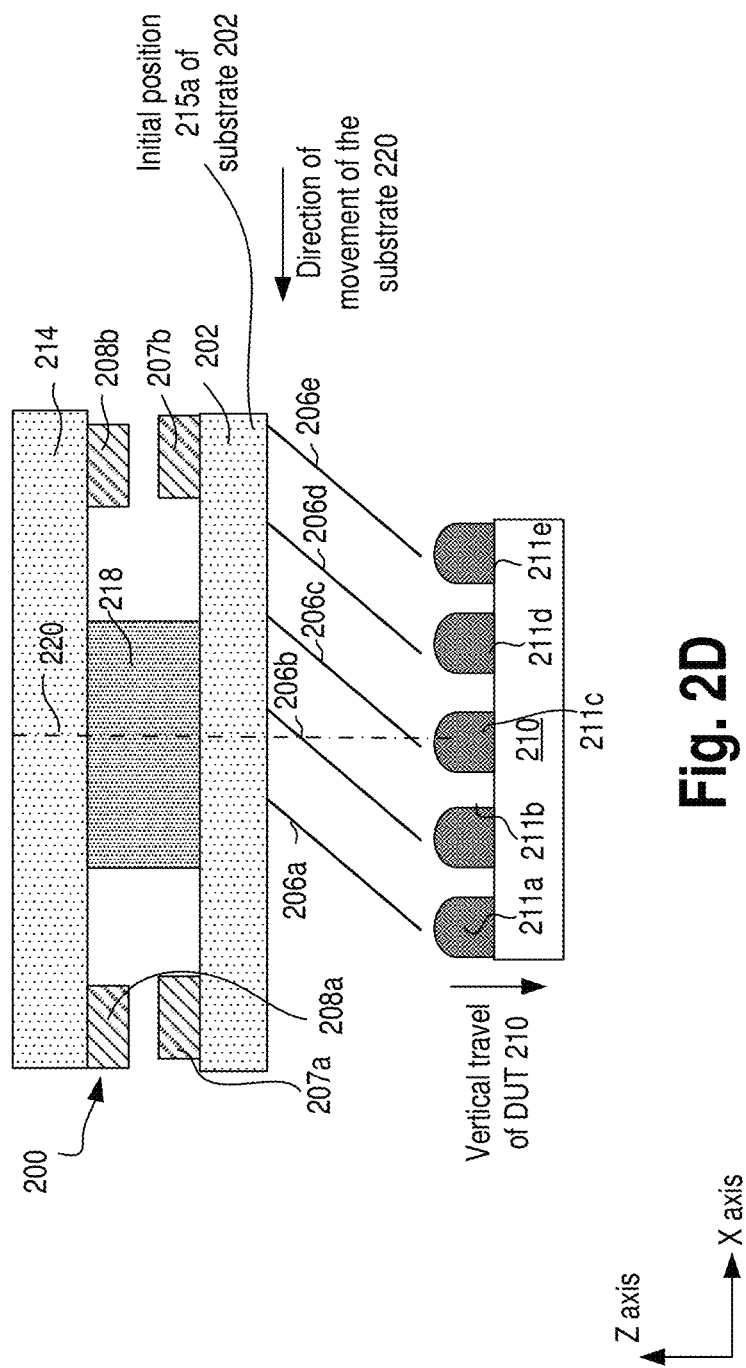

FIG. 2D illustrates a scenario where the compression force between the probes 206 and the interconnect structures 211 ceases (e.g., upon completion of the testing of the DUT 210), and the DUT is moved vertically downwards (e.g., opposite to the Z axis) such that the probes 206 and the interconnect structures 211 are no longer touching. Thus, due to the return magnetic force, the substrate 202 moves from the offset position 215b back to the neutral position 215a. In an example, the return from the offset position 215b to the neutral position may be initiated upon initiation of the relief of the compression force between the probes 206 and the interconnect structures 211.

Figure 3:
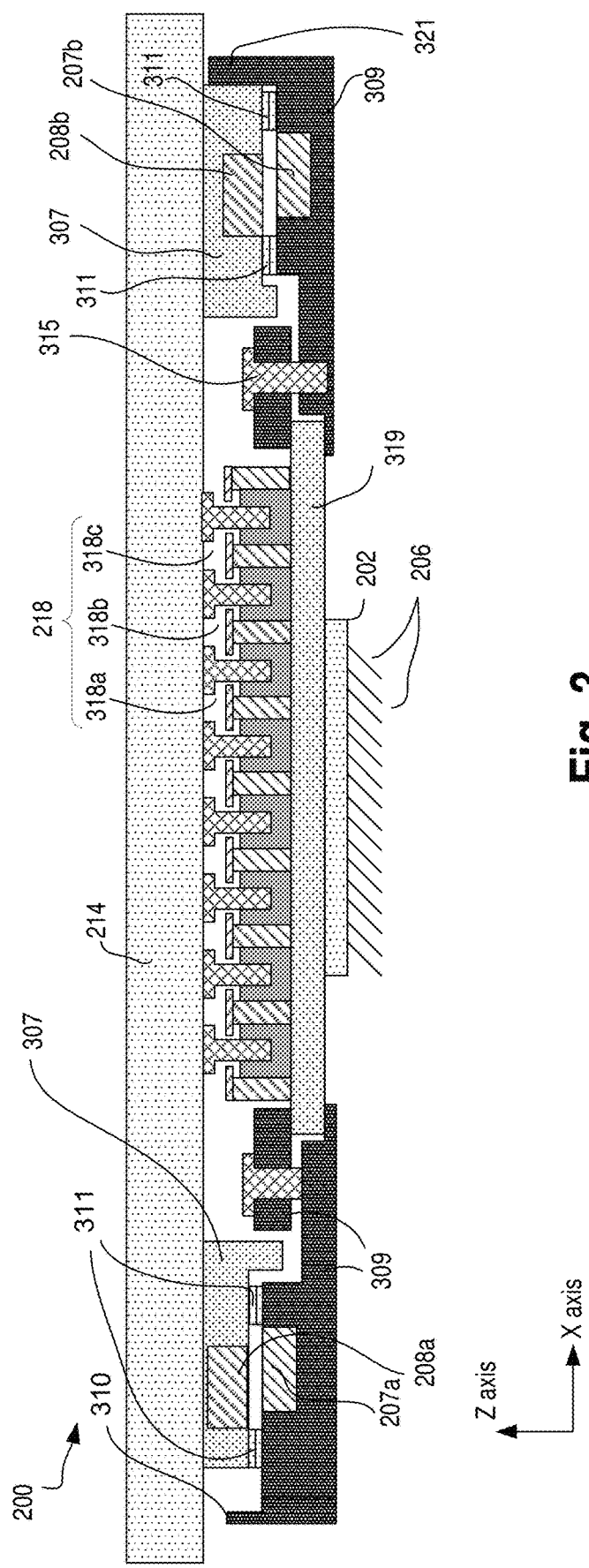
FIG. 3 illustrates the electrical test apparatus of FIGS. 2A-2D in further details, according to some embodiments.

FIG. 3 illustrates the electrical test apparatus 200 of FIGS. 2A-2D in further details, according to some embodiments. The substrate 202 in FIG. 3 is illustrated to be in the initial position 215a. A cross sectional view of the apparatus 200 is illustrated in FIG. 3.

For example, in FIG. 3, multiple probes 206 are illustrated to be attached from the substrate 202. A number and an arrangement of the probes 206 in FIG. 3 are merely examples, and do not limit the scope of this disclosure.

In some embodiments, the substrate 202 is attached to a support structure 319 (also referred to as support 319, probe support structure 319, or substrate support structure 319). In some embodiments, the support 319 is also laterally movable along with the substrate 202.

In some embodiments, the apparatus 200 includes a probe array carrier 309 (also referred to as substrate carrier 309, or a carrier 309). In an example, the substrate 202 is attached to the carrier 309 via the support 319. The carrier 309, the support 319, and the substrate 202 move laterally relative to a DUT, as discussed with respect to FIGS. 2A-2D. In some embodiments, the carrier 309 is coupled to the support 319 via clamp screws 315. In some embodiments, the magnets 207a and 207b are attached to the carrier 309, as illustrated in FIG. 3.

In some embodiments, the apparatus 200 includes the base 214, which may be a test card (e.g., a printed circuit board or PCB) that includes one or more processors and memory to test the DUT 210. In another example, the base 214 may be a test card coupled to one or more components, where the one or more components include one or more processors and memory to test the DUT 210.

In some embodiments, the base 214 is attached to a base housing 307 (also referred to as housing 307). The housing 307 is affixed to the base 217. The base 214 and the housing 307 does not laterally move with the substrate 202. In some embodiments, the magnets 208a and 208b are attached to the housing 307.

In some embodiments, the magnets 207 do not touch the corresponding magnets 208. For example, there may be an air gap between the magnet 207a and 208a, and there may be an air gap between the magnet 207b and 208b.

As previously discussed herein, the magnets 207a and 207b may be either substantially aligned, or slightly misaligned, with respect to the magnets 208a and 208b, respectively, when the substrate 202 is at the initial position 215a. For example, FIG. 3 illustrates the initial position 215a of the substrate 202, and also illustrated slight misalignment between the magnets 207a and 208a, and also between the magnets 207b and 208b. Thus, even at the initial position 215, the carrier 309 may experience a small magnetic force to move the substrate 202 further towards the left (e.g., to align the respective magnets).

A hard-stop component 321 may prevent the substrate 202 from any further movement towards left. For example, at the initial position 215a of the substrate 202, the hard stop component 321 (e.g., which may be part of the carrier 309) may contact the housing 307, and prevent any movement of the carrier 319 towards left, thereby preventing full alignment of the respective magnets.

At the initial position 215a, the substrate 202 may be substantially aligned with a DUT (e.g., DUT 210 not illustrated in FIG. 3), such that a probe 202 of the substrate 202 is to contact a corresponding target interconnect structure 211 of the DUT 210 (e.g., when the DUT is moved vertically upward towards the probes 206).

In some other embodiments and although not illustrated in FIG. 3, the magnet 307a are fully aligned with the magnet 308a, and the magnet 307b are fully aligned with the magnet 308b, when the substrate 202 is at the initial position 215a.

In some embodiments, the carrier 309 contacts the housing 307 via low friction surfaces 311. For example, the surfaces 311 may be machine-smoothed, Teflon coated, and/or the like, to reduce a friction between the carrier 309 and the housing 307. The low friction of the surfaces 311 may allow smooth lateral movement of the carrier 309 relative to the housing 307.

In some embodiments, in addition to providing the return magnetic force (e.g., to move the carrier 309 and the substrate 202 from the offset position 215b to the initial position 215a), the magnets 207, 208 also help keep the carrier 309 attached to, or near to, the housing 307. Put differently, the magnets 207, 208 may pull the carrier 309 vertically upwards in the Z axis direction, thereby ensuring that the carrier 309 does not fall down (e.g., aid in vertical retention of the carrier 309). In some embodiments, the carrier 309 is attached to the housing 307 via the upward magnetic force (e.g., solely via the upward magnetic force) in the Z axis direction.

In some embodiments, the carrier 309 further includes another hard-stop 310. For example, the hard-stop 321 is at one side of the apparatus 200, while the hard-stop 310 is at another side of the apparatus 200. The hard-stop 321 may restrict a maximum lateral movement of the substrate 202. Thus, once the substrate 202 reaches the offset position 215b (or reaches a maximum permissible offset position), the hard-stop 310 (e.g., a right edge of the hard-stop 310) may contact the housing 307 (e.g., a left edge of the housing 307), thereby preventing any further movement of the substrate 202 beyond the maximum permissible lateral movement.

Figure 4:
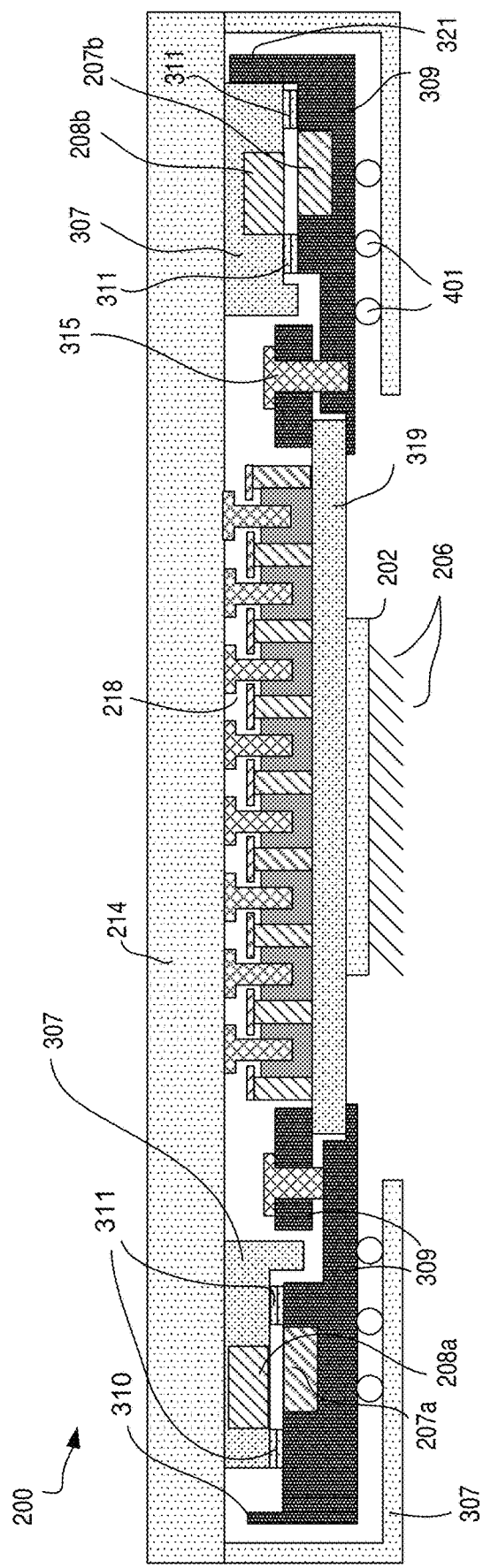
FIG. 4 illustrates the apparatus of FIG. 3, with rollers between a carrier and an extension of a housing, according to some embodiments.

In some embodiments, the carrier 309 is also vertically supported by a non-movable housing of the apparatus 200. For example, FIG. 4 illustrates the apparatus 200 of FIG. 3, with rollers 401 between the carrier 309 and an extension of the housing 307, according to some embodiments. The rollers 401 allow lateral movement of the carrier 309, and also vertically support the carrier 309. Although rollers 401 are illustrated in FIG. 4, any other type of structure (e.g., ball bearings, air pressure, springs, etc.) may also vertically support the carrier 309.

Referring again to FIG. 3, the interconnect layers 218 electrically couple the probes 206 to the base 214. For example, the probes 206 are coupled to the support 319 via traces, interconnect structures, redistribution layers, etc. within the substrate 202 and the support 319. The interconnect layers 218 electrically couple the support 319 to the base 214, even when the support 319 moves laterally with the substrate 319.

The interconnect layers 218 may be realized using a variety of manner, e.g., using springs (e.g., where a first end of a spring is electrically coupled to a probe 206 via the support 319 and the substrate 202, and a second end of the spring is electrically coupled to the base 214), flexible wires (e.g., where a first end of a wire is electrically coupled to a probe 206 via the support 319 and the substrate 202, and a second end of the wire is electrically coupled to the base 214), low force pogos, pins, etc. In the example of FIG. 3, the interconnect layers 218 may be realized using a plurality of well structures 318*a*, 318*b*, 318*c*, etc. For example, a well 318 may couple a specific probe 206 to terminal of the base 214.

Figure 5A:
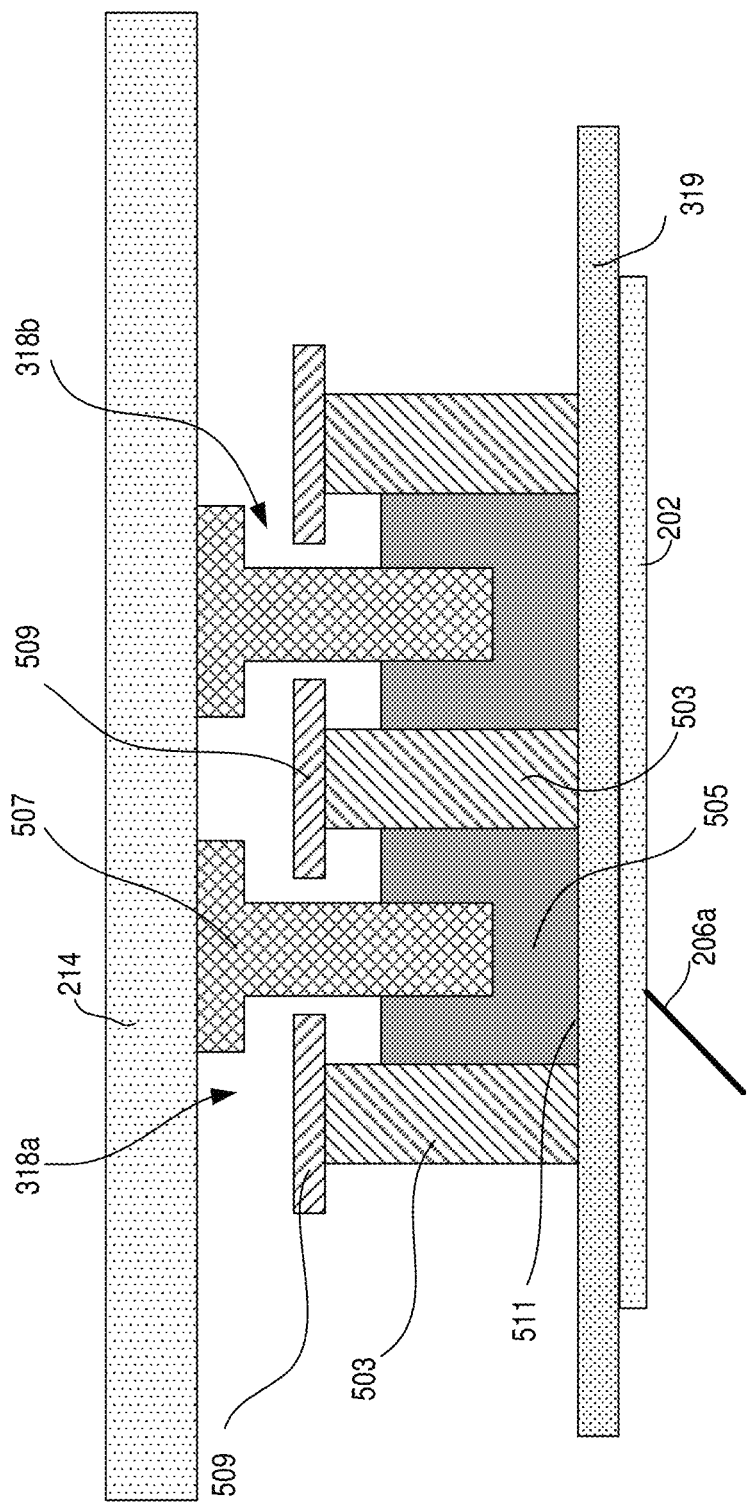
FIG. 5A illustrates a well that may electrically couple a probe to a base of the apparatus of FIG. 3, according to some embodiments.

FIG. 5A illustrates a well 318*a* that may electrically couple a probe 206*a* to the base 214 of the apparatus 200, according to some embodiments. Two adjacent wells 318*a* and 318*b* are illustrated in FIG. 5A and merely the well 318*a* is labeled and discussed herein, and the other wells of the interconnect layers 218 may be similar to the well 318*a*. FIG. 5A illustrates a cross sectional view of the wells 318. FIG. 5A illustrates a single probe 206*a*, the substrate 202, the wells 318*a* and 318*b*, and the base 214, while various other components of the apparatus 200 are not illustrated.

In some embodiments, the well 318*a* includes one or more sidewalls, e.g., sidewalls 503. A conductive fluid 505 may be deposited within the sidewalls 503 of the well 318*a*. The well 318*a* may also include one or more covers 509. In some embodiments, the well 318*a*, including the sidewalls 503, the fluid 505 and the covers 509, are fixed with respect to the substrate 202 and the support 319. For example, the well 318*a*, including the sidewalls 503, the fluid 505 and the covers 509, laterally moves along with the substrate 202.

In some embodiments, the fluid 505 is a non-Newtonian conductive fluid, e.g., a non-Newtonian conductive liquid. In some embodiments, the fluid 505 is a high viscosity conductive liquid (e.g., high viscosity conductive liquid metal). For example, the fluid 505 may somewhat cling to the sidewalls 503, which may avoid or reduce any spillage of the fluid 505 outside the well 318*a*. Examples of fluid 505 may include liquid metal, mercury, gallium, indium, and/or the like. In some embodiments, to further avoid any spillage of the fluid 503 from the well 318*a*, an opening of the well 318*a* is at least partially covered using one or more covers 509.

In some embodiments, a bottom surface 511 of the well 318*a* is conductive. For example, the bottom surface 511 may be nickel or nickel plated. For example, nickel may not dissolve in the fluid 505 (e.g., may not dissolve in a liquid metal of the fluid 505). In another example, another appropriate conductive material (e.g., which may not dissolve in the fluid 505) may be used to plate or form the bottom surface 511. In some embodiments, at least sections of the surfaces of the sidewalls 503 are also conductive (e.g., plated with nickel).

In some embodiments, the bottom surface 511 of the well is electrically coupled to a corresponding probe 206*a*, e.g., through the support 319 and the substrate 202. At least sections or cores of the sidewalls 511 are non-conductive, such that a well 318*a* is electrically isolated from a neighboring well 318*b*.

In some embodiments, a conductive member 507 is immersed in the fluid 505. The member 507 is attached to the base 214. The member 507 is immovable or rigid relative to the base 214. Thus, the base 214, along with the member 507, does not move, when the substrate 202 moves between the initial position 215*a* and the offset position 215*b*. The member 507 is electrically coupled to the base 214. In an example, the member 507 is a conductive pin, a conductive beam, and/or the like. In some embodiments, the member 507 includes conductive material, such as Nickel, Nickel plated material, an appropriate conductive material (e.g., that does not react with or dissolve in the fluid 503), and/or the like.

When the well 318*a*, including the fluid 503 moves with the substrate 202, the member 507 remains immersed in the fluid 505. Thus, the fluid 505 moves relative to the member 507. The fluid 503 may provide negligible or very less opposition to the relative lateral movement and/or vertical movement of the member 507 through the fluid 503 (e.g., the fluid 503 does not inhibit the movement of the member 507 through the fluid 503). The member 507 may extend through the covers 509 (e.g., the covers 509 may be soft covers that allows the member 507 to move). This allows the member 507 to be rigid or immovable, while the well 318*a*, along with the fluid 503 and the covers 509, move laterally along with the substrate 202. In some embodiments, as the bottom surface 511, the fluid 505, and the member 507 are conductive, electrical connection is maintained between the probe 206*a* and the base 214, e.g., even when the well 318*a* moves laterally along with the substrate 202.

In some embodiments, instead of the well structure comprising conductive fluid (e.g., as discussed with respect to FIG. 5A), the interconnect layers 218 may be realized using a variety of manner, e.g., using springs (e.g., where a first end of a spring is electrically coupled to a probe 206 via the support 319 and the substrate 202, and a second end of the spring is electrically coupled to the base 214), flexible wires (e.g., where a first end of a wire is electrically coupled to a probe 206 via the support 319 and the substrate 202, and a second end of the wire is electrically coupled to the base 214), low force pogos, pins, etc.

Figure 5B:
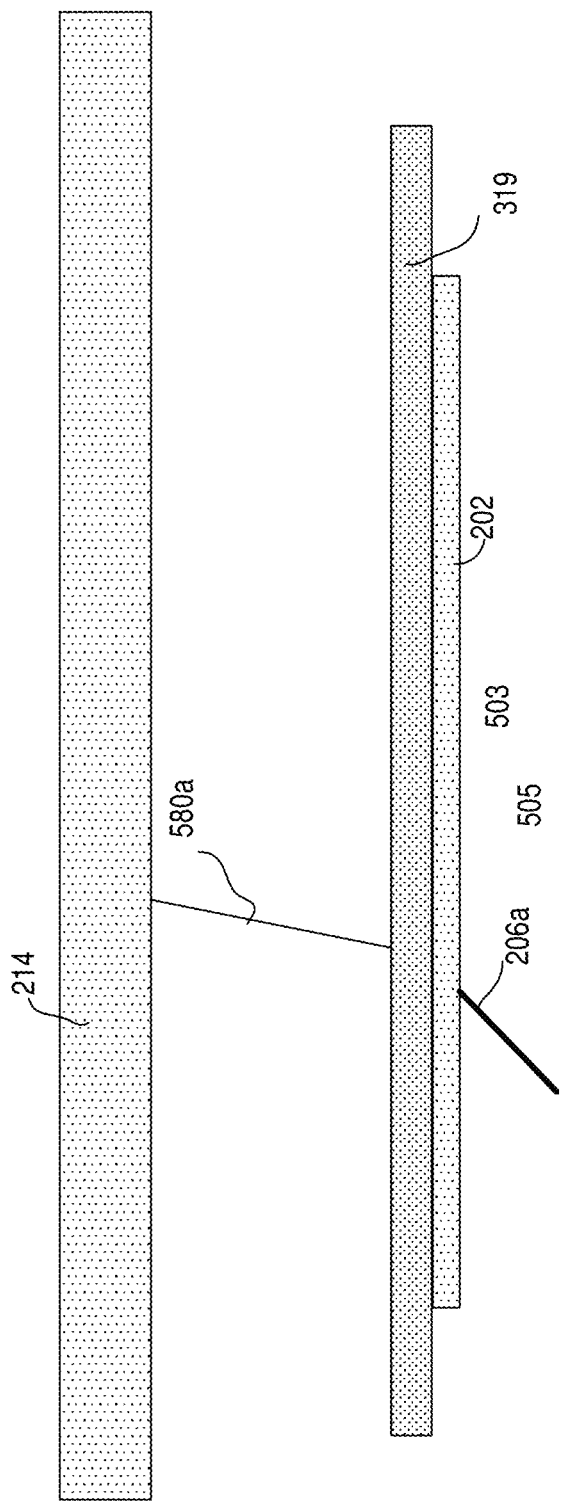
FIG. 5B illustrates a flexible component 580a that may electrically couple a probe 206a to the base 214 of the apparatus 200, according to some embodiments.

For example, FIG. 5B illustrates a flexible component 580*a* that may electrically couple a probe 206*a* to the base 214 of the apparatus 200, according to some embodiments. FIG. 5B illustrates a cross sectional view, and illustrates a single probe 206*a*, a single corresponding component 580*a*, the substrate 202, the wells 318*a* and 318*b*, and the base 214, while various other components of the apparatus 200 are not illustrated. The component 580*a* is illustrated schematically, without illustrating an actual shape or layout of the component 580*a*. Although a single component 580*a* is illustrated, there may be a plurality of such components, each coupling a corresponding probe 206 to a corresponding terminal of the base 214.

The component 580*a* may be a spring, a flexible wire, a low force pogo pin, pins, etc. In an example, the component 580*a* may be at least in part flexible, e.g., may allow lateral movement of the support 319 and the substrate 202 with respect to the base 214, while the component provides electrical coupling between the probe 206*a* and a corresponding terminal of the base 214.

Figure 6:
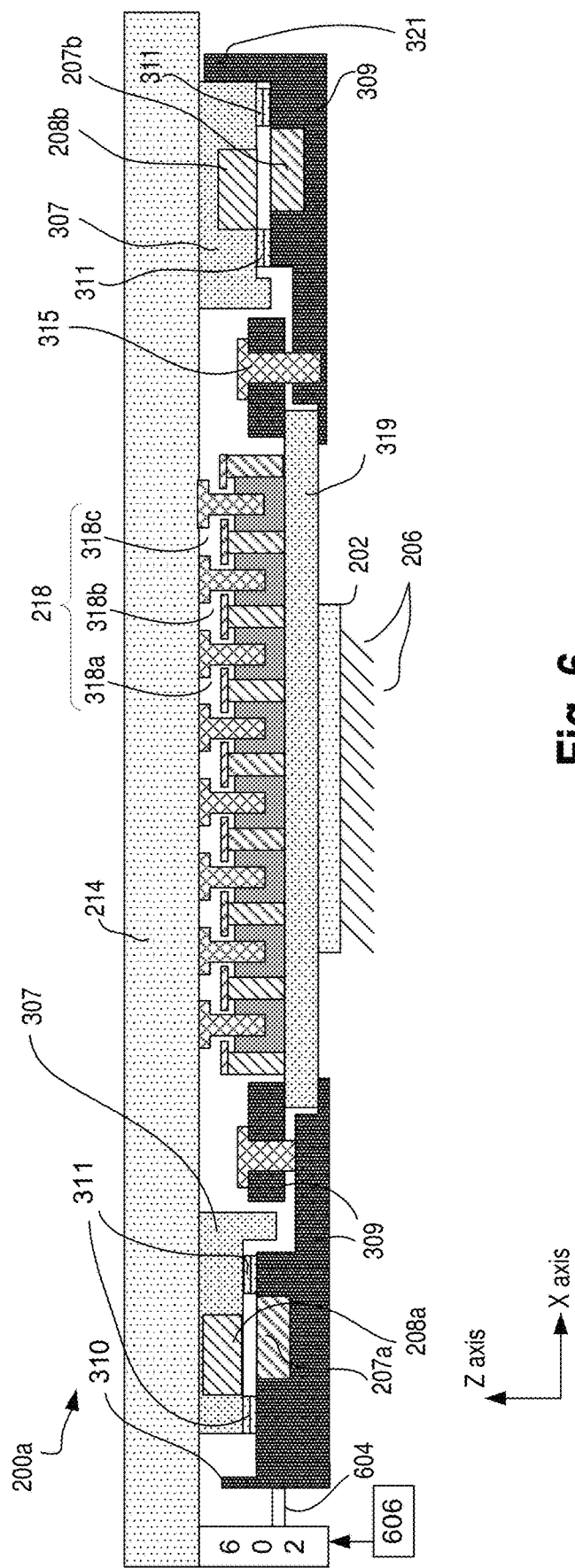
FIG. 6 illustrates an actuator that may aid in the lateral movement of a substrate of an electrical test apparatus, according to some embodiments.

FIG. 6 illustrates an actuator 602 that may aid in the lateral movement of the substrate 202 of an apparatus 200a, according to some embodiments. The apparatus 200a illustrated in FIG. 6 is at least in part similar to the apparatus 200 of FIGS. 2A-4. However, unlike the apparatus 200, the apparatus 200a includes an actuator 602, a coupling 604 between the actuator 602 and the carrier 309, and/or one or more sensors 606.

In some embodiments, the sensors 606 sense when the probes 206 make contact with and/or are compressed against the interconnect structures 211 of the DUT 210. Merely as an example, the sensors 606 may sense a contact and/or a compression by monitoring or sensing electrical coupling between the probes 206 and the interconnect structures 211 (e.g., may monitor current through the probes 206).

In another example, the sensors 606 may monitor the space underneath the probes 206. When the sensors 606 sense something being placed in the space, the sensors 606 conclude a contact and/or a compression between the probes 206 and the interconnect structures 211. In such an example, the sensors 606 may include a light emitting element and a light sensing element, where the interconnect structures 211 of the DUT 210 (or the DUT 210) may interrupt the light when the contact is being made.

In yet another example, the sensors 606 may be embedded within a support carrying the DUT 210, and may indicate a contact when the support carrying the DUT 210 has reached within a threshold vertical distance from the apparatus 200a. In yet another example, any appropriate type of sensing may be used for the sensor 606.

In some embodiments, the sensor 606 provides feedback to the actuator 602, e.g., indicating contact between the probes 206 and the interconnect structures 211 of the DUT 210, and/or indicating initiation of compression between the probes 206 and the interconnect structures 211 of the DUT 210. In some embodiments, based on such indication, the actuator 602 mechanically moves the substrate 202 from the initial position 215a to the offset position 215b in the lateral direction. In an example, the force for the lateral movement of the substrate 202 is provided by the actuator 602 and/or by the compression force between the probes 206 and the interconnect structures 211 of the DUT 210. The actuator 602 may include a motor, an air pressure based actuator, an actuator that uses a force from a spring, etc. The actuator 602 may also provide a return force to return the substrate 202 from the offset position 215b to the initial position 215a.

Figure 7:
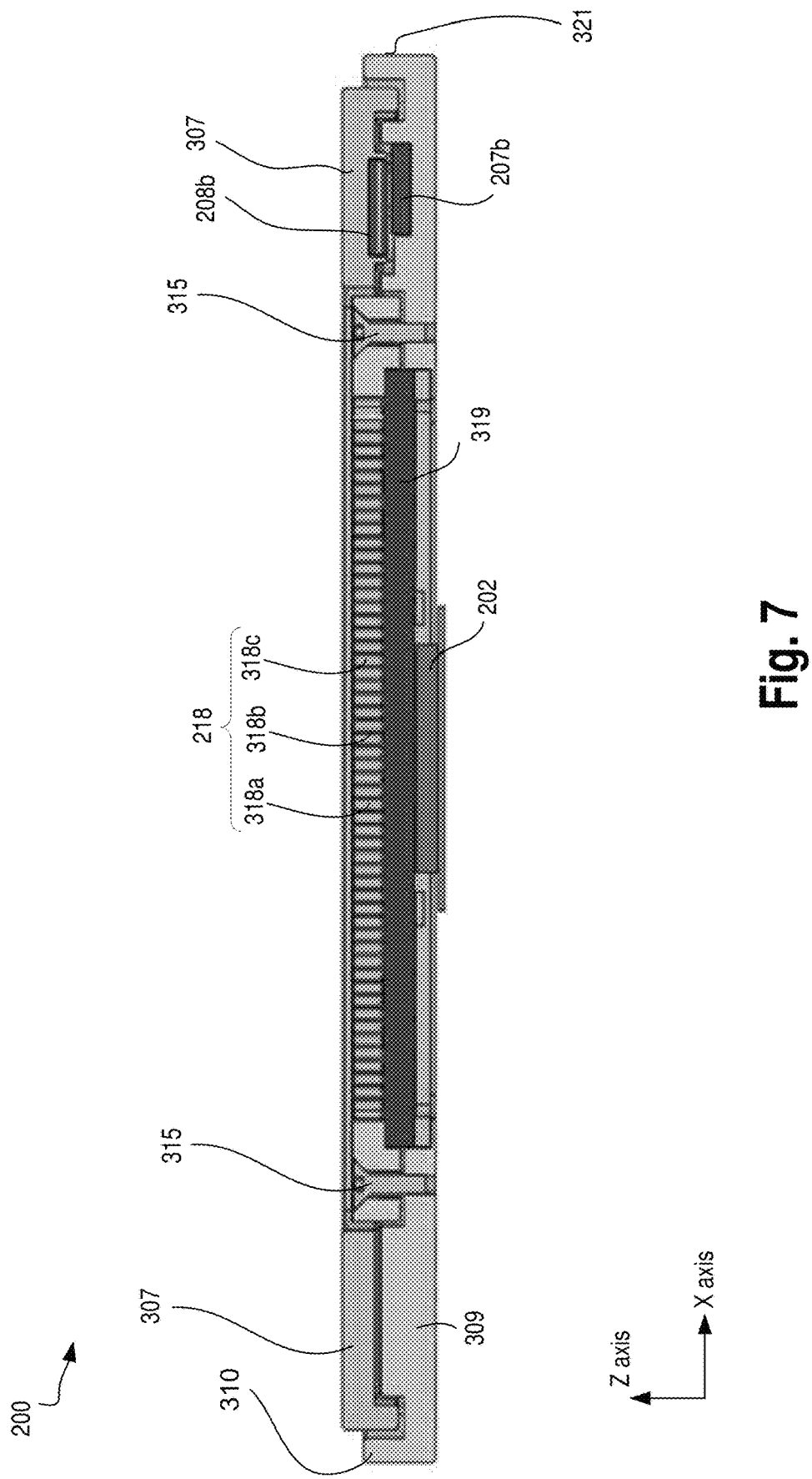
FIG. 7 illustrates the apparatus of FIGS. 2A-4 in further details, according to some embodiments.

FIG. 7 illustrates the apparatus 200 of FIGS. 2A-4 in further details, according to some embodiments. In FIG. 7, some components of the apparatus 200 are not illustrated (e.g., relative to the illustration of the apparatus 200 in FIG. 3). For example, the base 214, the probes 206, the surface 311, etc. are not illustrated in FIG. 7. Furthermore, in the cross-sectional view of FIG. 7, the magnets 207a and 208a are not visible. FIG. 7 would be apparent to those skilled in the art, e.g., based on the illustration and associated discussion of the apparatus 200 in FIG. 3 and various other figures. Accordingly, FIG. 7 is not discussed in further details herein.

Figure 8:
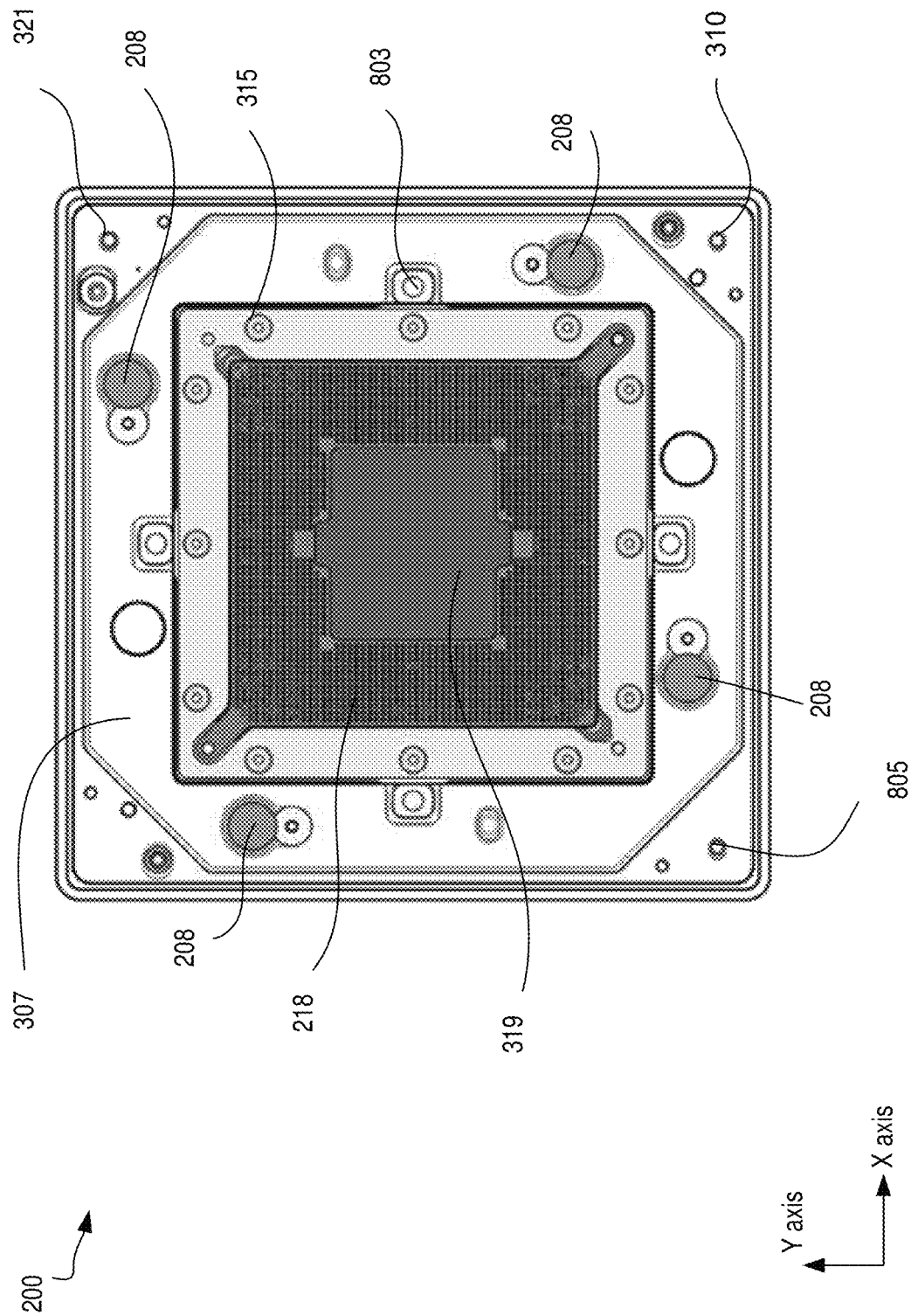
FIG. 8 illustrates a top-down view of the apparatus of FIGS. 2A-7, according to some embodiments.

FIG. 8 illustrates a top-down view of the apparatus 200 of FIGS. 2A-7, according to some embodiments. In the top-down view, the base 214 is not illustrated (or illustrated as being transparent). The top-down view of FIG. 8 illustrates the hard-stop components 310 and 321, which may be dowel horizontal hard-stops. Also illustrated is a rotational constraining hard-stop component 805 (not illustrated in FIG. 3), which may restrict any rotational motion of the carrier 309. Thus, the hard-stop components 310, 321, and 805, in combination, merely allows lateral movement of the carrier 309 within a permissible distance range (e.g., up to a maximum of 500 microns).

Also illustrated are the magnets 208. In FIG. 8, four magnets 208 are illustrated, although only two magnets 208a and 208b may be visible in the cross-sectional view of FIG. 3. FIG. 8 also illustrates clamp screws 315, and the interface layers 208 including the array of wells 318. A base fastening hole location 803 are also illustrated, where the base 214 may be fastened to the housing 307 via such fastening hole locations 803. Also illustrated is the support 319. The substrate 202 and the probes 206 (not visible in the top-down view of FIG. 8) are underneath the support 319.

Figure 9:
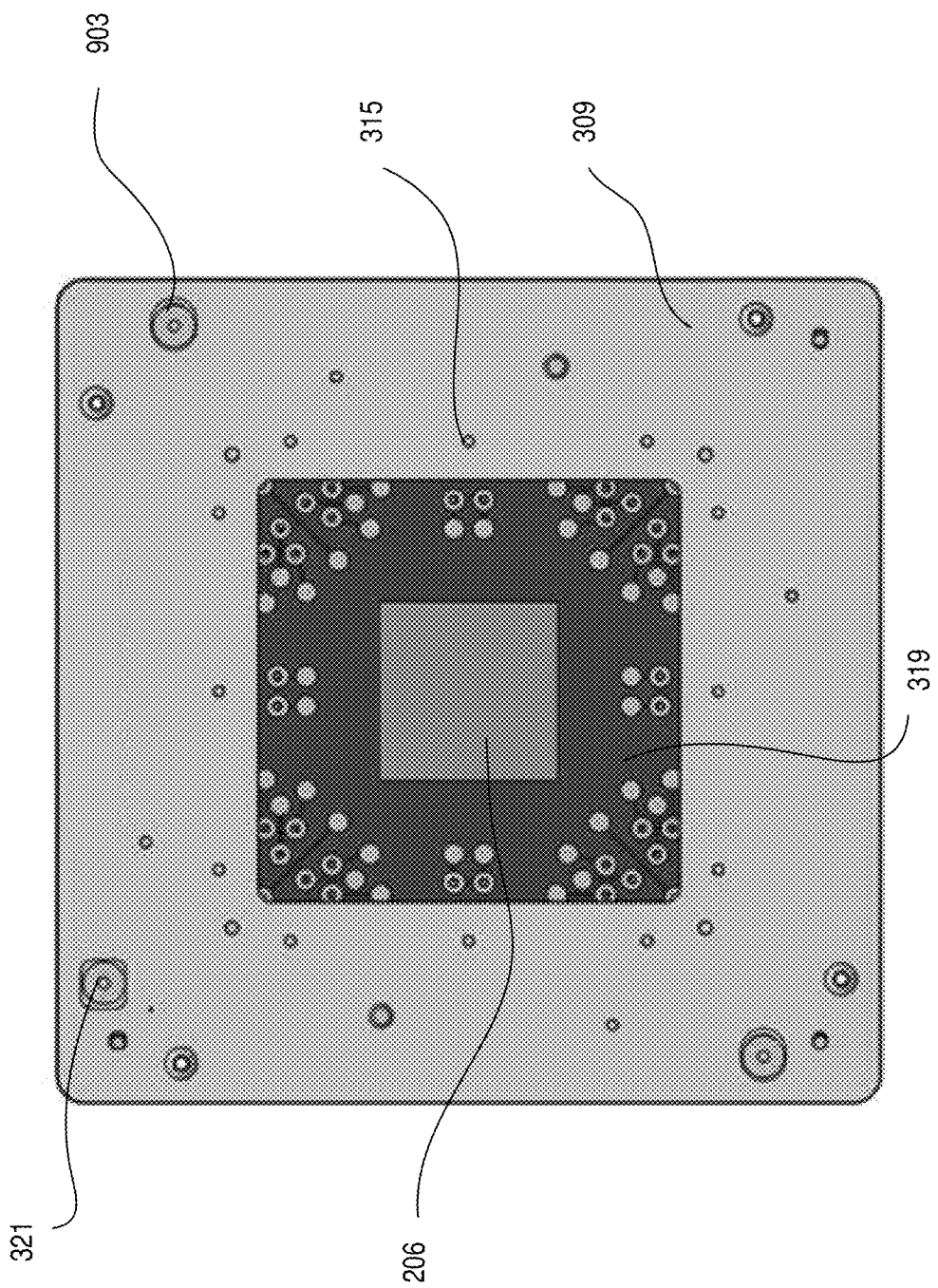
FIG. 9 illustrates a probe-side view (e.g., bottom-up view) of the apparatus of FIGS. 2A-8, according to some embodiments.

FIG. 9 illustrates a probe-side view (e.g., bottom-up view) of the apparatus 200 of FIGS. 2A-8, according to some embodiments. In the probe-side view, the probes 214 are illustrated using a square (e.g., individual probes are not visible). Also illustrated are the carrier 309, the clamp screws 315, the hard-stop component 321, and the support 319.

As discussed with respect to FIG. 3, the carrier 309 may be vertically retained by the magnetic forces of the magnets 207 and 208. FIG. 4 provides another example of backup vertical support provided by extensions of the housing 307. In some embodiments (and although not illustrated in FIG. 3), the apparatus 200 further includes a secondary or backup retention mechanism including one or more screws 903 (e.g., two shoulder screws). The screws 903 may be used to prevent a catastrophic failure of the carrier 309 fully separating or falling off from the housing 307, e.g., in case the magnets 307 and 308 cannot vertically hold the carrier 309. In an example, the screws 903 may extend through the carrier 309, without touching the carrier 309 (e.g., a hole through which a screw 903 is extended may be larger than a diameter of the screw 903, due to which the screw 903 may not touch the sidewalls of the hole within the carrier 309). However, in the event of the magnets 307 and 308 failing to vertically retain the carrier 309, the screws 903 may prevent the carrier 309 from falling off.

Referring to FIGS. 2A-9, in some embodiments, various modifications of the apparatus 200 may be envisioned by those skilled in the art, based on the teachings of this disclosure. For example, instead of the magnets 207 and 208, a spring based return coupling arrangement may be used. For example, a first end of a spring may be attached to the housing 307 and a second end of the spring may be attached to the carrier 309. At the initial position 215a of the substrate, the spring may be at its resting state (e.g., may not be extended or compressed), and the spring may not experience any tension. When the substrate 202 moves from the initial position 215a to the final position 215b, the spring may be at a tension state (e.g., may be extended or compressed), and the spring may want to return to its resting state, thereby providing the return force to bring back the substrate 202 from the offset position 215b to the initial position 215a.

In some other examples, the return force may be provided by polymers, air pressure, and/or another appropriate energy storing device (e.g., which stores energy when the substrate 202 moves from the initial position 215a to the final position 215b, and the stored energy provides the return force to bring back the substrate 202 from the offset position 215b to the initial position 215a).

Various embodiments discussed with respect to FIGS. 2A-9 assume that the carrier 309 and components attached to the carrier 309 (e.g., the support 319, the substrate 202, the probes 206, etc.) move laterally, while the base 214 and the DUT 210 are fixed or rigid. This results in a lateral movement between the substrate 202 and the DUT 210. However, the lateral movement between the substrate 202 and the DUT 210 may be facilitated by any other appropriate manner.

For example, the apparatus 200 may be fixed or rigid, and the DUT 210 (and possibly a support frame or chuck that holds the DUT) may move laterally (e.g., upon contact and/or compression between the probes 206 and the interconnect structures 211). The lateral movement of the DUT 210 may be facilitated by the compression force between the probes 206 and the interconnect structures 211 and/or by an external force provided by an actuator.

In yet another example, the entire apparatus 200 (e.g., the substrate 202 and the base 214) may move relative to the DUT 210. The lateral movement of the substrate 202 and the base 214 may be facilitated by the compression force between the probes 206 and the interconnect structures 211 and/or by an external force provided by an actuator.

Figure 10:
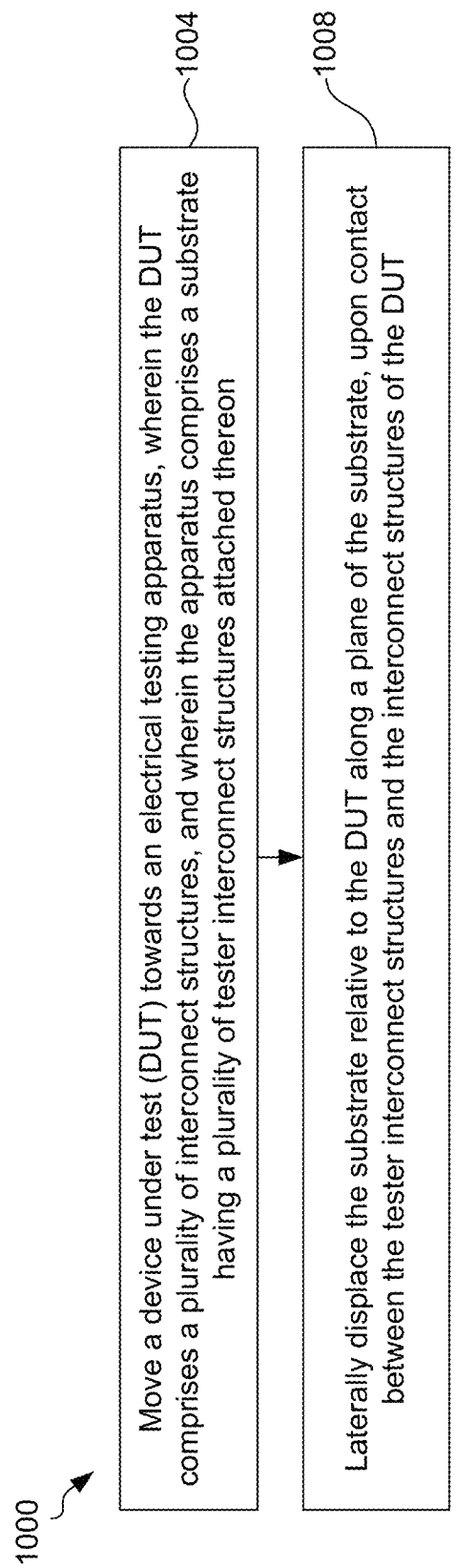
FIG. 10 is a flow diagram illustrating a method of operating the apparatus of FIGS. 2A-9, according to some embodiments.

FIG. 10 is a flow diagram illustrating a method 1000 of operating the apparatus 200 of FIGS. 2A-9, according to some embodiments. Although the blocks in the flowchart with reference to FIG. 10 are shown in a particular order, the order of the actions can be modified. Thus, the illustrated embodiments can be performed in a different order, and some actions/blocks may be performed in parallel. Some of the blocks and/or operations listed in FIG. 10 may be optional in accordance with certain embodiments. The numbering of the blocks presented is for the sake of clarity and is not intended to prescribe an order of operations in which the various blocks must occur.

At 1004 of the method 1000, a DUT (e.g., DUT 210) is moved towards an electrical testing apparatus (e.g., apparatus 200). In some embodiments, the DUT includes a plurality of interconnect structures (e.g., interconnect structures 211), and the apparatus includes a probe support substrate (e.g., substrate 202) having a plurality of tester interconnect structures (e.g., probes 206) attached thereon. At 1008 of the method 1000, the substrate may be laterally displaced relative to the DUT along a plane of the substrate, upon contact and/or compression between the tester interconnect structures and the interconnect structures of the DUT.

Figure 11:
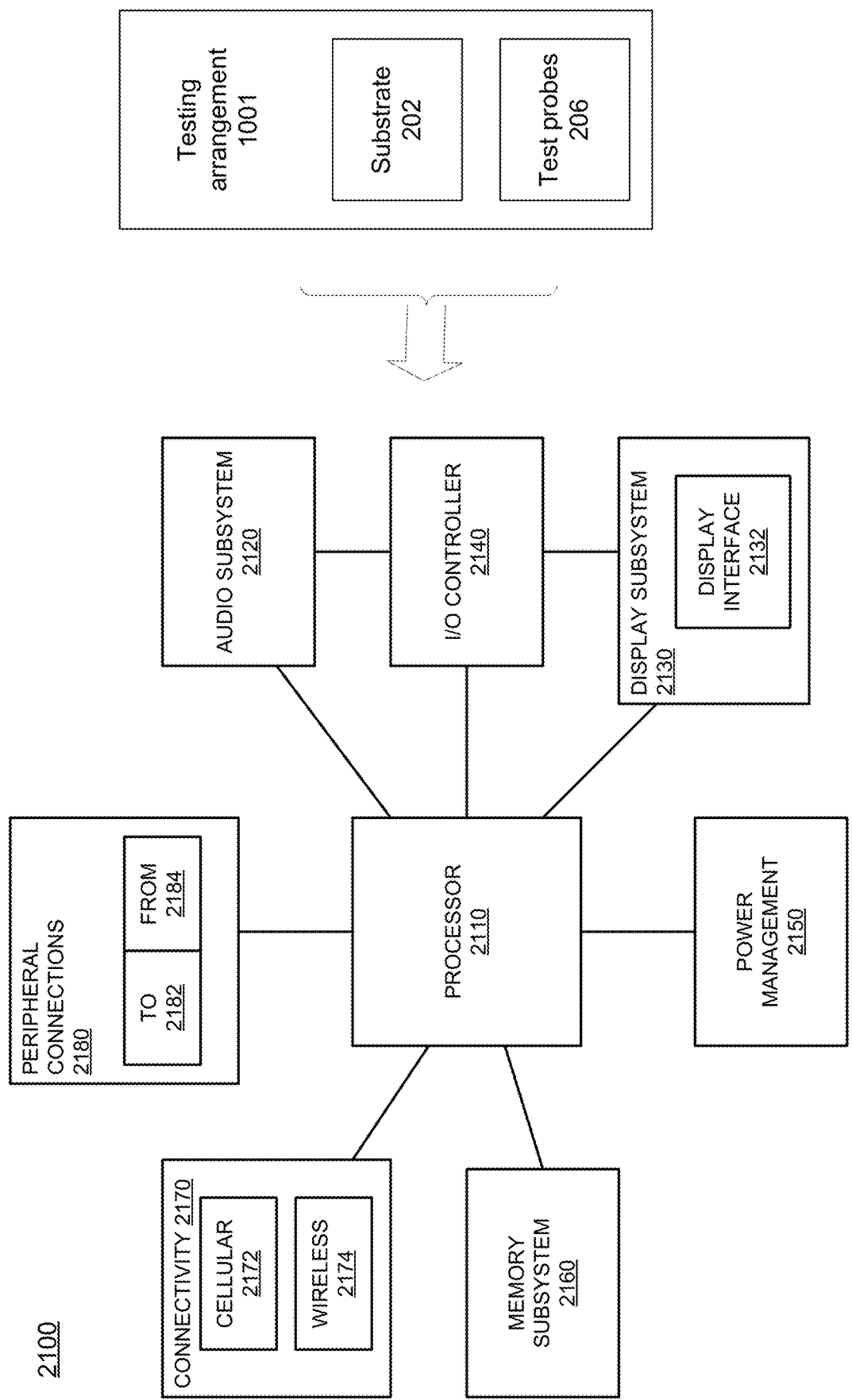
FIG. 11 illustrates a computing device including a testing arrangement, where the testing arrangement includes probes and a probe support substrate, and where the probe support substrate is laterally movable relative to a DUT along a plane of the substrate, upon contact between the probes and the interconnect structures of the DUT, according to some embodiments.

FIG. 11 illustrates a computing device 2100 including a testing arrangement 1001, where the testing arrangement 1001 includes the probes 206 and the probe support substrate 202, and where the probe support substrate 202 is laterally movable relative to a DUT 210 along a plane of the substrate, upon contact between the probes 206 and the interconnect structures 211 of the DUT 210, according to some embodiments. It is pointed out that those elements of FIG. 8 having the same reference numbers (or names) as the elements of any other figure can operate or function in any manner similar to that described, but are not limited to such.

In some embodiments, computing device 2100 represents an appropriate computing device, such as a computing tablet, a server, a workstation, a mobile phone or smartphone, a laptop, a desktop, an IOT device, a wireless-enabled e-reader, or the like. It will be understood that certain components are shown generally, and not all components of such a device are shown in computing device 2100.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant. The processor 2110 may be a SoC or a computing unit.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100. In one embodiment, computing device 2100 includes a clock generation subsystem 2152 to generate a clock signal.

Elements of embodiments are also provided as a machine-readable medium (e.g., memory 2160) for storing the computer-executable instructions (e.g., instructions to implement any other processes discussed herein). The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 2180 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

In some embodiments, the computing device 2100 may be used to test various DUTs, e.g., the DUT 210 discussed herein. For example, the computing device 2100 may include a testing arrangement 1001, which may include the probes 206 and the probe support substrate 202. In some embodiments, the probe support substrate 202 is laterally movable relative to the DUT 210 along a plane of the substrate 202, upon contact between the probes 206 and the interconnect structures 211 of the DUT 210, as discussed with respect to FIGS. 2A-9. In some embodiments, the processor 2110 may execute instructions stored in a memory of the memory subsystem 2160, e.g., to test one or more DUTs.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1. An electrical testing apparatus comprising: a plurality of tester interconnect structures comprising electrically conductive material cantilevered from a first side of a substrate; and a base coupled to a second side of the substrate via one or more interconnect layers, wherein the tester interconnect structures are to contact corresponding interconnect structures of a device under test (DUT), and wherein the substrate is laterally movable relative to the DUT along a plane of the substrate, upon contact between the tester interconnect structures and the interconnect structures of the DUT.

Example 2. The apparatus of example 1 or any other example, wherein the substrate is laterally movable relative to the DUT along the plane of the substrate, upon compression of the tester interconnect structures and the interconnect structures of the DUT.

Example 3. The apparatus of example 1 or any other example, wherein the substrate is laterally movable relative to the base along the plane of the substrate, upon contact between the tester interconnect structures and the interconnect structures of the DUT.

Example 4. The apparatus of example 1 or any other example, wherein the substrate is laterally movable in a direction that reduces lateral displacement between the tester interconnect structures and the interconnect structures of the DUT.

Example 5. The apparatus of example 1 or any other example, further comprising: a return coupling comprising one or both of: one or more magnets, or one or more springs; wherein the return coupling is to allow lateral movement of the substrate from a first position to a second position during a compression of the tester interconnect structures and interconnect structures of the DUT, and to allow the substrate to return to the first position upon relief of the compression.

Example 6. The apparatus of example 5 or any other example, wherein the return coupling comprises: a first magnet attached to a housing that holds the base; and a second magnet attached to a carrier that holds the substrate, wherein the first and second magnet are positioned such that: the first magnet is offset relative to the second magnet by a first distance, while the substrate is at the first position relative to the base; the first magnet is offset relative to the second magnet by a second distance, while the substrate is at the second position relative to the base, wherein the second distance is higher than the first distance; wherein when the first magnet is offset relative to the second magnet by the second distance, a magnetic force is generated to bring the substrate back to the first position.

Example 7. The apparatus of example 6 or any other example, further comprising: a hard-stop to restrain the lateral movement of the substrate relative to the DUT beyond a threshold distance, such that a non-zero threshold value of the first distance is maintained.

Example 8. The apparatus of example 6 or any other example, wherein the first distance is substantially zero.

Example 9. The apparatus of example 5 or any other example, wherein the return coupling comprises: a spring having: a first end attached to a housing that houses the base, and a second end attached a carrier that holds the substrate, wherein the spring is at a substantially resting state, while the substrate is at the first position relative to the base; wherein the spring is at a tension state, while the substrate is at the second position relative to the base; and wherein when the spring is at the tension state, a force in the spring is to bring the substrate back to the first position.

Example 10. The apparatus of any of examples 1-9 or any other example, wherein the one or more interconnect layers comprise: a well comprising a sidewall and a conductive bottom surface, wherein the bottom surface of the well is electrically coupled to one of the tester interconnect structures; a conductive fluid within the well; and a conductive member immersed within the conductive fluid, the conductive member electrically coupled to the base; wherein the well and the conductive fluid are laterally movable with the substrate relative to the base, upon contact between the tester interconnect structures and the interconnect structures of the DUT, and wherein the conductive member is immovable relative to the base, upon contact between the tester interconnect structures and the interconnect structures of the DUT.

Example 11. The apparatus of example 10 or any other example, wherein the one or more interconnect layers further comprise: a cover over the well, wherein the conductive member extends through the cover, and is movable relative to the cover.

Example 12. The apparatus of example 10 or any other example, wherein: the bottom surface of the well comprises Nickel; the conductive member comprises a Nickel pin or a Nickel coated pin; and the conductive fluid comprises one or more of: a non-Newtonian fluid, a liquid metal, Gallium, Indium, or Mercury.

Example 13. The apparatus of any of examples 1-9 or any other example, wherein the one or more interconnect layers comprise: a flexible component attached between the base and the substrate, the flexible component allowing lateral movement of the substrate relative to the base while electrically coupling a corresponding tester interconnect structure and the base.

Example 14. The apparatus of any of examples 1-9 or any other example, further comprising: a hard-stop arrangement to restrain the lateral movement of the substrate relative to the DUT to a threshold distance.

Example 15. The apparatus of any of examples 1-9 or any other example, further comprising: one or more sensors to sense one or both of contact or compression between the tester interconnect structures and the interconnect structures of the DUT; and one or more actuators to laterally move the substrate relative to the DUT along the plane of the substrate, based on an output from the one or more sensors.

Example 16. An electrical-test system comprising: a base comprising: a memory to store instructions, and a processor to execute the instructions to test Integrated Circuit (IC) devices; and a substrate, wherein a first side of the substrate is coupled to the base via one or more interconnect layers; and a plurality of tester interconnect structures comprising electrically conductive material attached to a second side of the substrate, wherein the tester interconnect structures are to contact corresponding interconnect structures of a device under test (DUT), and wherein the substrate is laterally movable relative to the DUT along a plane of the substrate, upon contact between the tester interconnect structures and the interconnect structures.

Example 17. The system of example 16 or any other example, further comprising: a carrier to house the substrate; a housing to house the base; a magnetic coupling between the housing the carrier, the magnetic coupling to retain a vertical position of the carrier relative to the housing; and one or more screws attached between the carrier and the housing, the one or more screws separate from the coupling, wherein the one or more screws are to extend through the carrier, wherein the one or more screws are to be not in physical contact with the carrier, during a testing of the DUT, and wherein the one or more screws are to substantially retain the vertical position of the carrier relative to the housing, in response to at least a partial failure of the magnetic coupling.

Example 18. The system of example 17 or any other example, wherein the substrate is laterally movable relative to the base along the plane of the substrate, upon compression between the tester interconnect structures and the interconnect structures of the DUT.

Example 19. A method comprising: moving a device under test (DUT) towards an electrical testing apparatus, wherein the DUT comprises a plurality of interconnect structures, and wherein the apparatus comprises a substrate having a plurality of tester interconnect structures attached thereon; and laterally displacing the substrate relative to the DUT along a plane of the substrate, upon contact between the tester interconnect structures and the interconnect structures of the DUT.

Example 20. The method of example 19 or any other example, wherein the tester interconnect structures are attached to a first side of the substrate, wherein the apparatus comprises a base coupled to a second side of the substrate via one or more interconnect layers, and wherein the base remains laterally fixed relative to the DUT while the substrate is laterally displaced relative to the DUT.

Example 21. The method of any of examples 19-20 or any other example, where the substrate is laterally displaced in a first direction upon contact between the tester interconnect structures and the interconnect structures, and wherein the method further comprises: testing the DUT by transmitting current between one or more tester interconnect structures and corresponding one or more interconnect structures of the DUT; and subsequent to testing the DUT, laterally displacing the substrate relative to the DUT in a second direction that is opposite to the first direction.

Example 22. An apparatus comprising: means for moving a device under test (DUT) towards an electrical testing apparatus, wherein the DUT comprises a plurality of interconnect structures, and wherein the electrical testing apparatus comprises a substrate having a plurality of tester interconnect structures attached thereon; and means for laterally displacing the substrate relative to the DUT along a plane of the substrate, upon contact between the tester interconnect structures and the interconnect structures of the DUT.

Example 23. The apparatus of example 22 or any other example, wherein the tester interconnect structures are attached to a first side of the substrate, wherein the electrical testing apparatus comprises a base coupled to a second side of the substrate via one or more interconnect layers, and wherein the base remains laterally fixed relative to the DUT while the substrate is laterally displaced relative to the DUT.

Example 24. The apparatus of any of examples 22-23 or any other example, where the substrate is laterally displaced in a first direction upon contact between the tester interconnect structures and the interconnect structures, and wherein the apparatus further comprises: means for testing the DUT by transmitting current between one or more tester interconnect structures and corresponding one or more interconnect structures of the DUT; and means for laterally displacing the substrate relative to the DUT in a second direction that is opposite to the first direction, subsequent to testing the DUT.

Example 25. An apparatus comprising: means for performing the method of any of the examples 19-21 or any other example.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An electrical testing apparatus comprising:
   a plurality of tester interconnect structures comprising electrically conductive material cantilevered from a first side of a substrate; and
   a base coupled to a second side of the substrate via one or more interconnect layers,
   wherein the tester interconnect structures are to contact corresponding interconnect structures of a device under test (DUT), and
   wherein the substrate is laterally movable relative to the DUT along a plane of the substrate by a lateral component of a force applied to the substrate through contact between the tester interconnect structures and the interconnect structures of the DUT when the tester interconnect structures are compressed vertically against the interconnect structures of the DUT.

2. The apparatus of claim 1, wherein the substrate is laterally movable relative to the base along the plane of the substrate, upon contact between the tester interconnect structures and the interconnect structures of the DUT through which the force is applied to the substrate.

3. The apparatus of claim 1, wherein the substrate is laterally movable in a direction that reduces the lateral component of force between the tester interconnect structures and the interconnect structures of the DUT.

4. The apparatus of claim 1, further comprising:
   a return coupling comprising one or both of: one or more magnets, or one or more springs;
   wherein the return coupling is to allow lateral movement of the substrate from a first position to a second position in response to an increase in the compression of the tester interconnect structures by interconnect structures of the DUT, and to return the substrate to the first position in response to a decrease in the compression.

5. The apparatus of claim 4, wherein the return coupling comprises:
   a first magnet attached to a housing that holds the base; and
   a second magnet attached to a carrier that holds the substrate,
   wherein the first and second magnet are positioned such that:
      the first magnet is offset relative to the second magnet by a first distance, while the substrate is at the first position relative to the base;
      the first magnet is offset relative to the second magnet by a second distance, while the substrate is at the second position relative to the base, wherein the second distance is larger than the first distance;

wherein when the first magnet is offset relative to the second magnet by the second distance, a magnetic force is generated to bring the substrate back to the first position.

6. The apparatus of claim 5, further comprising:
a hard-stop to restrain the lateral movement of the substrate relative to the DUT beyond a threshold distance, such that a non-zero threshold value of the first distance is maintained.

7. The apparatus of claim 5, wherein the first distance is substantially zero.

8. The apparatus of claim 4, wherein the return coupling comprises:
a spring having: a first end attached to a housing that houses the base, and a second end attached a carrier that holds the substrate,
wherein the spring is at a substantially resting state, while the substrate is at the first position relative to the base;
wherein the spring is at a tension state, while the substrate is at the second position relative to the base; and
wherein when the spring is at the tension state, a force in the spring is to return the substrate back to the first position.

9. The apparatus of claim 1, wherein the one or more interconnect layers comprise:
a flexible component attached between the base and the substrate, the flexible component allowing lateral movement of the substrate relative to the base while electrically coupling a corresponding tester interconnect structure and the base.

10. The apparatus of claim 1, further comprising:
a hard-stop arrangement to restrain the lateral movement of the substrate relative to the DUT to a threshold distance.

11. The apparatus of claim 1, further comprising:
one or more sensors to sense one or both of contact or compression between the tester interconnect structures and the interconnect structures of the DUT; and
one or more actuators to laterally move the substrate relative to the DUT along the plane of the substrate, based on an output from the one or more sensors.

12. An electrical testing apparatus comprising:
a plurality of tester interconnect structures comprising electrically conductive material cantilevered from a first side of a substrate; and
a base coupled to a second side of the substrate via one or more interconnect layers,
wherein the tester interconnect structures are to contact corresponding interconnect structures of a device under test (DUT), and
wherein the substrate is laterally movable relative to the DUT along a plane of the substrate, upon contact between the tester interconnect structures and the interconnect structures of the DUT, wherein the one or more interconnect layers comprise:
a well comprising a sidewall and a conductive bottom surface, wherein the bottom surface of the well is electrically coupled to one of the tester interconnect structures;
a conductive fluid within the well; and
a conductive member immersed within the conductive fluid, the conductive member electrically coupled to the base;
wherein the well and the conductive fluid are laterally movable with the substrate relative to the base, upon contact between the tester interconnect structures and the interconnect structures of the DUT, and
wherein the conductive member is immovable relative to the base, upon contact between the tester interconnect structures and the interconnect structures of the DUT.

13. The apparatus of claim 12, wherein the one or more interconnect layers further comprise:
a cover over the well, wherein the conductive member extends through the cover, and is movable relative to the cover.

14. The apparatus of claim 12, wherein:
the bottom surface of the well comprises Nickel;
the conductive member comprises a Nickel pin or a Nickel coated pin; and
the conductive fluid comprises one or more of: a non-Newtonian fluid, a liquid metal, Gallium, Indium, or Mercury.

15. An electrical-test system comprising:
a base comprising: a memory to store instructions, and a processor to execute the instructions to test Integrated Circuit (IC) devices; and
a substrate, wherein a first side of the substrate is coupled to the base via one or more interconnect layers;
a carrier to house the substrate;
a housing to house the base;
a magnetic coupling between the housing the carrier, the magnetic coupling to retain a vertical position of the carrier relative to the housing;
one or more screws attached between the carrier and the housing, the one or more screws separate from the coupling; and
a plurality of tester interconnect structures comprising electrically conductive material attached to a second side of the substrate,
wherein the tester interconnect structures are to contact corresponding interconnect structures of a device under test (DUT),
wherein the substrate is laterally movable relative to the DUT along a plane of the substrate in response to a lateral component of force applied through contact between the tester interconnect structures and the interconnect structures;
wherein the one or more screws are to extend through the carrier,
wherein the one or more screws are not to be in physical contact with the carrier during a testing of the DUT, and
wherein the one or more screws are to substantially retain the vertical position of the carrier relative to the housing, in response to at least a partial failure of the magnetic coupling.

16. The system of claim 15, wherein the substrate is laterally movable relative to the base along the plane of the substrate, upon compression between the tester interconnect structures and the interconnect structures of the DUT.

17. A method comprising:
moving a device under test (DUT) towards an electrical testing apparatus, wherein the DUT comprises a plurality of interconnect structures, and wherein the apparatus comprises a substrate having a plurality of tester interconnect structures cantilevered therefrom; and
laterally displacing the substrate relative to the DUT along a plane of the substrate by a lateral component of a force applied to the substrate through contact between the tester interconnect structures and the interconnect structures of the DUT when the tester interconnect structures are compressed vertically against the interconnect structures of the DUT.

18. The method of claim 17, wherein the tester interconnect structures are attached to a first side of the substrate, wherein the apparatus comprises a base coupled to a second side of the substrate via one or more interconnect layers, and wherein the base remains laterally fixed relative to the DUT while the substrate is laterally displaced relative to the DUT.

19. The method of claim 17, where the substrate is laterally displaced in a first direction upon contact between the tester interconnect structures and the interconnect structures, and wherein the method further comprises:
   testing the DUT by transmitting current between one or more tester interconnect structures and corresponding one or more interconnect structures of the DUT; and
   subsequent to testing the DUT, laterally displacing the substrate relative to the DUT in a second direction that is opposite to the first direction.

\* \* \* \* \*